United States Patent [19]

Gasparek

[11] 4,161,785

[45] Jul. 17, 1979

[54] MATRIX MULTIPLIER

[75] Inventor: Emery P. Gasparek, Camillus, N.Y.

[73] Assignee: General Electric Company, Syracuse, N.Y.

[21] Appl. No.: 852,501

[22] Filed: Nov. 17, 1977

[51] Int. Cl.[2] ........................ G06G 7/19; G06G 7/16; H03K 5/159

[52] U.S. Cl. ........................ 364/827; 357/24; 364/844; 364/862

[58] Field of Search ............... 364/819, 824, 827, 820, 364/862, 728, 725, 726; 357/24; 307/221 C, 221 D; 328/167

[56] References Cited

U.S. PATENT DOCUMENTS

| | | | |
|---|---|---|---|
| 3,492,470 | 1/1970 | Gorbatenko | 364/819 |
| 3,979,582 | 9/1976 | Mims | 328/167 |
| 3,999,152 | 12/1976 | Sato et al. | 307/221 D |
| 4,025,907 | 5/1977 | Karp et al. | 357/24 |
| 4,028,699 | 6/1977 | Stevens | 364/728 |

*Primary Examiner*—Felix D. Gruber

*Attorney, Agent, or Firm*—Richard V. Lang; Carl W. Baker

[57] ABSTRACT

A matrix multiplier is described for multiplying sampled data in analog format by a matrix of stored values also in analog format and of positive or negative sign. The analog input quantity in the form of an electrical charge is applied to individual circuit elements making up the matrix. Each circuit element contains a capacitive storage means for encoding a stored value. An output term proportional to the product of the applied charge and the capacitance is produced in each circuit element. The input quantities are applied to the circuit elements in parallel by rows, and the output quantities are derived in parallel by columns to achieve matrix multiplication. In one form, the multiplier is a matrix of one stage charged coupled devices, each using a partitioned electrode storage site with the partitioning varying from element to element. The invention leads to a simple and high speed design. The invention is applicable to the computation of the Discrete Fourier Transformation.

7 Claims, 8 Drawing Figures

MATRIX MULTIPLIER

BACKGROUND OF THE INVENTION

1. Field of the Invention

The invention relates to a matrix multiplier for use in computations in which the operands are in analog format and in which the terms of the matrix are fixed and assume both positive and negative values. The matrix multiplier is designed for processing sampled analog data supplied to paralleled inputs representing an input vector and produces output data on paralleled outputs at the sampling rate, corresponding to an output vector. The output vector is proportional to the product of the matrix of stored values and the input vector. An important application of the invention is to the computation of the Discrete Fourier Transformation.

2. Description of the Prior Art

A number of matrix multipliers have been described in the prior art. When the devices require digital inputs, the raw data, usually in the analog format, must be converted to digital format at the input of the processor. In addition, in digital format, multiplication causes word growth with accompanying delays which force one to add active or passive storage to compensate for the processing time. In computations of the Fast Fourier Transform, it is known to store the complex trigonometric weights in a memory, which is accessed for processing with the input data. One such approach is described in the U.S. Pat. No. 4,020,334, entitled "Integrated Arithmetic Unit for Computing Summed Indexed Products" of Noble R. Powell and John M. Irwin and assigned to the Assignee of the present invention.

An implementation of the Discrete Fourier Transform using the charge coupled device has been suggested using the chirp "Z" algorithm, IEEE Transactions of Audio and Acoustics, Volume AU-17, #2, June 1969. The implementation of the chirp "Z" algorithm with charge coupled devices requires four correlator channels preceded by a complex multiplication by certain trigonometric weights. This operation is then followed by a "de-chirp" filter again requiring complex trigonometric weights. In this implementation, also the total circuit requirements are complex.

SUMMARY OF THE INVENTION

Accordingly, it is an object of the present invention to provide an improved matrix multiplier.

It is another object of the invention to provide an improved matrix multiplier in which the input and output quantities are in analog format.

It is another object of the invention to provide a matrix multiplier in which the input and output quantities are in analog format and having a high speed of computation.

It is still another object of the invention to provide an improved matrix multiplier in which the input and output quantities are in analog format and in which the values of the matrix are fixed.

It is yet another object of the invention to provide a matrix multiplier in which the input and output quantities are in analog format and in which the values of the matrix are fixed and assume both positive and negative values.

It is an additional object of the invention to provide an improved matrix multiplier for use in computation of the Fourier Transform with respect to sampled data.

These and other objects of the invention are achieved in a novel matrix multiplier. The multiplier comprises a plurality of electrical input terminals for simultaneous application of a plurality ($\bar{X}$) of ordered analog input quantities.

$$\bar{X} = \begin{vmatrix} x_1 \\ x_2 \\ \cdot \\ \cdot \\ x_j \\ \cdot \\ \cdot \\ x_m \end{vmatrix}$$

A plurality of electrical circuit elements are provided, arranged in a two dimensional array having rows and columns, each circuit element having a weight corresponding to a respective fixed coefficient of a two dimensional matrix (A) of fixed coefficients, where $$A = \begin{vmatrix} a_{11}\ a_{12} \ldots a_{1m} \\ a_{21}\ a_{22} \\ a_{ij} \\ a_{n1} \quad a_{nm} \end{vmatrix} \text{ and}$$

terminal means for applying an input and for deriving an output. Means are provided for interconnecting the terminal means of the circuit elements in each row to a respective multiplier input terminal for applying a common input quantity ($x_j$) to each element in said row, each circuit element producing a product ($a_{ij}x_j$) proportional to the weight of the fixed coefficient ($a_{ij}$) of said electrical circuit element and to the applied analog input quantity ($x_j$). Means are also provided for interconnecting the output terminal means of the circuit elements in each column for deriving an output ($y_i$) equal to the sum of products in each column of circuit elements, where $$Y_i = \sum_{j=1}^{m} a_{ij} x_j = a_{i1} x_1 + a_{i2} x_2 \ldots + a_{im} x_m.$$

A plurality of output circuit means are also provided, each coupled to a respective column interconnecting means for deriving an ordered output quantity ($\bar{Y}$), where $$\bar{Y} = \begin{vmatrix} y_1 \\ y_2 \\ \vdots \\ y_i \\ \vdots \\ y_n \end{vmatrix} = A\bar{X}.$$

This output quantity corresponds to the multiplication of the two dimensional matrix (A) of fixed coefficient by the plurality ($\bar{X}$) of ordered analog input quantities.

In accordance with an aspect of the invention, the circuit elements each comprise a capacitive storage means having a capacity determining the magnitude of the fixed coefficient. To determine the magnitude and sign of the fixed coefficient, a pair of capacitive storage means are provided in which one capacitor element is associated with coefficients of one sign and the other with coefficients of the other sign, the algebraic difference in capacity between the storage means corresponding to the sign and magnitude of the fixed coefficient. In addition, each column interconnecting means comprises a first means for interconnecting the first capacitive storage means and a second means for interconnecting the second capacitive storage means in the column of the circuit elements. The output circuit means thus comprises a differential amplifier whose inputs are coupled respectively to the first and second interconnecting means of the associated column of circuit elements for subtractively combining the output quantities.

In a preferred form of the invention the analog input quantity to each circuit element constitutes a charge, and the output quantity a voltage. The capacitive storage means are conductor-insulator-semiconductor charge storage cells, integrated on a common substrate, and the charge is coupled to each charge storage cell by charge transfer from an adjacent semiconductor region on the common substrate. A suitable construction is one in which each circuit element comprises one stage of a charge coupled device.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

FIG. 2A is a plan view of the circuit elements and FIG. 2B is a sectional view of the circuit element taken along the sectional lines 2—2.

DESCRIPTION OF THE PREFERRED EMBODIMENTS

Figure 1:
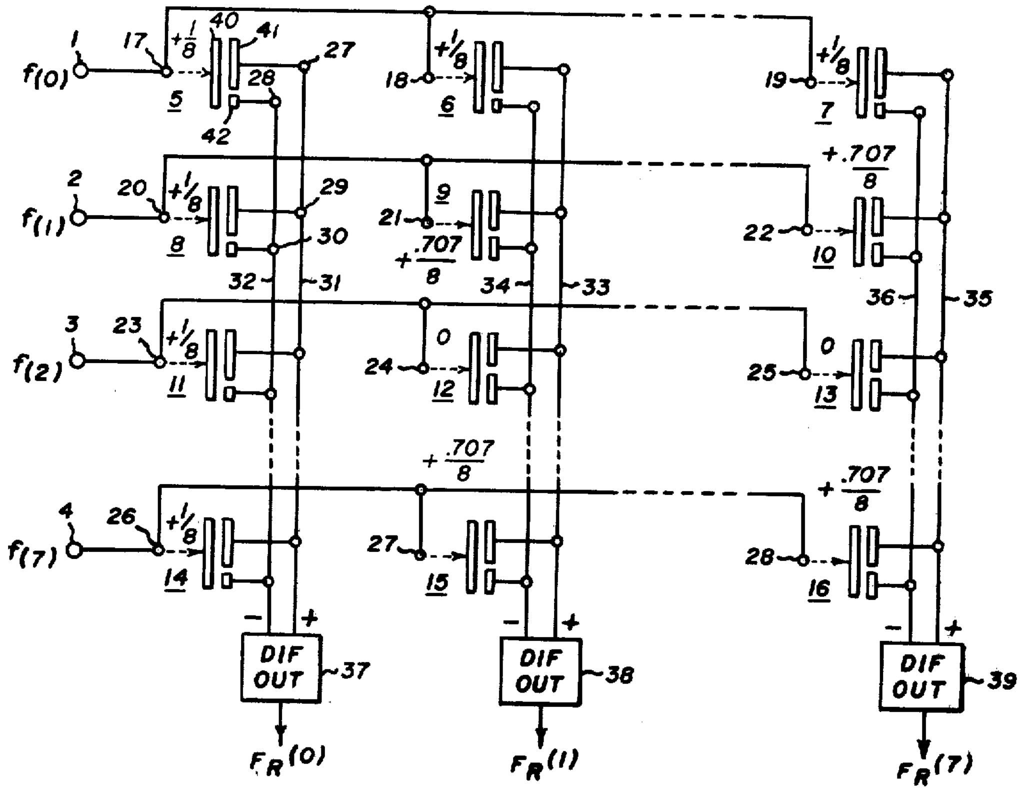
FIG. 1 is a simplified equivalent circuit representation of a matrix multiplier consisting of a two dimensional array of circuit elements embodying a matrix of stored values for multiplication with an ordered sequence of analog input quantities. The illustrated embodiment performs the real portion of an eight point Fourier Transform.

The matrix multiplier of FIG. 1 is designed to accept an ordered sequence of analog input quantities $x_1 \ldots X_j \ldots x_m$, also known as a vector "$\bar{X}$"

$$\bar{X} = \begin{vmatrix} x_1 \\ x_2 \\ \vdots \\ x_j \\ \vdots \\ x_m \end{vmatrix} \tag{1}$$

and perform a multiplication of that vector by a matrix A of stored values:

$$A = \begin{vmatrix} a_{11}\, a_{12} & & & a_{1m} \\ a_{21}\, a_{22} & & & \\ \vdots & \ddots & & \\ \vdots & & a_{ij} & \\ \vdots & & & \ddots \\ a_{n1} & \cdots & \cdots & a_{nm} \end{vmatrix} \tag{2}$$

The matrix A has m columns, corresponding to the number of analog input quantities and is square, but not necessarily so. The product $\bar{Y}$ is symbolized:

$$\bar{Y} = A\bar{X} \tag{3}$$

where $\bar{Y}$ is also a vector of n terms. In the practical case contemplated here, the analog input quantities are typically time or frequency dependent analog functions, which are sampled for each computation. The output quantity $\bar{Y}$ may be computed at the data sampling rate.

More specifically, the matrix multiplier of FIG. 1 is designed to calculate the real part of an 8 point Discrete Fourier Transform.

The Discrete Fourier Transform for N sampled data points f(k), k=0, 1 . . . N−1 may be written in complex form as $$F(r) = \underbrace{\frac{1}{N}\sum_{k=0}^{N-1} f(k) \cos\frac{2\pi}{N} rk}_{\text{(Real Part)}} - \underbrace{j\frac{1}{N}\sum_{k=0}^{N-1} f(k) \sin\frac{2\pi}{N} rk}_{\text{(Imaginary Part)}} \tag{4}$$

where j=−1

For N=8, the real parts of the above transform require trigonometric weights of cos (rk 2π/8). These take on values of 0/8, ±⅛, ±cos 45°/8.

Expanding the real part of equation (4), the real Fourier coefficients become:

$$
\left.\begin{aligned}
F_r(0) &= \tfrac{1}{8}\,[f(0) + f(1) + f(2) + f(3) + f(4) + f(5) + f(6) + f(7)] \\
F_r(1) &= \tfrac{1}{8}\,[f(0) + .707f(1) + 0f(2) - .707f(3) - 1f(4) - .707f(5) + 0f(6) + .707f(7)] \\
F_r(2) &= \tfrac{1}{8}\,[f(0) + 0f(1) - 1f(2) + 0f(3) + 1f(4) + 0f(5) - 1f(6) + 0f(7)] \\
F_r(3) &= \tfrac{1}{8}\,[f(0) - .707f(1) + 0f(2) + .707f(3) - 1f(4) + .707f(5) + 0(6) - .707f(7)] \\
F_r(4) &= \tfrac{1}{8}\,[f(0) - f(1) + f(2) - f(3) + f(4) - f(5) + f(6) - f(7)] \\
F_r(5) &= F_r(3) \\
F_r(6) &= F_r(2) \\
F_r(7) &= F_r(1)
\end{aligned}\right\} \quad (5)
$$

The real Fourier coefficients may be expressed in matrix form as follows:

$$
\begin{vmatrix} F_r(0) \\ F_r(1) \\ F_r(2) \\ F_r(3) \\ F_r(4) \\ F_r(5) \\ F_r(6) \\ F_r(7) \end{vmatrix}
=
\begin{vmatrix}
\frac{1}{8} & \frac{1}{8} & \frac{1}{8} & \frac{1}{8} & \frac{1}{8} & \frac{1}{8} & \frac{1}{8} & \frac{1}{8} \\
\frac{1}{8} & \frac{.707}{8} & \frac{0}{8} & \frac{-.707}{8} & -\frac{1}{8} & \frac{-.707}{8} & \frac{0}{8} & \frac{.707}{8} \\
\frac{1}{8} & \frac{0}{8} & \frac{-1}{8} & \frac{0}{8} & \frac{1}{8} & \frac{0}{8} & \frac{-1}{8} & \frac{0}{8} \\
\frac{1}{8} & \frac{-.707}{8} & \frac{0}{8} & \frac{.707}{8} & -\frac{1}{8} & \frac{.707}{8} & \frac{0}{8} & \frac{-.707}{8} \\
\frac{1}{8} & \frac{-1}{8} & \frac{1}{8} & \frac{-1}{8} & \frac{1}{8} & \frac{-1}{8} & \frac{1}{8} & \frac{-1}{8} \\
\frac{1}{8} & \frac{-.707}{8} & \frac{0}{8} & \frac{+.707}{8} & -\frac{1}{8} & \frac{+.707}{8} & \frac{0}{8} & \frac{-.707}{8} \\
\frac{1}{8} & \frac{0}{8} & \frac{-1}{8} & \frac{0}{8} & \frac{1}{8} & \frac{0}{8} & \frac{-1}{8} & \frac{0}{8} \\
\frac{1}{8} & \frac{.707}{8} & \frac{0}{8} & \frac{-.707}{8} & -\frac{1}{8} & \frac{-.707}{8} & \frac{0}{8} & \frac{.707}{8}
\end{vmatrix}
\times
\begin{vmatrix} f(0) \\ f(1) \\ f(2) \\ f(3) \\ f(4) \\ f(5) \\ f(6) \\ f(7) \end{vmatrix}
\quad (6)
$$

where the values of the individual sampled data points ($f_0$ to $f_{N-1}$) are a vector ($\overline{F}$) representing the independent variable; the trigonometric weights provide the terms of an N by N matrix; and the Fourier coefficients are a vector ($\overline{F}_r$) representing the dependent variable.

The multiplication of successive sampled data points by a matrix of stored weights is performed in the physical embodiment represented in FIG. 1 to obtain a Fourier transform. Computation of the Fourier transform will be the practical application of principal interest in the balance of the discussion. However sonar and radar beamformer calculations, and applications such as matched filtering and correlation are also possible with the apparatus.

The matrix multiplier is shown in FIG. 1. It comprises a plurality of input terminals, an 8×8 array of circuit elements arranged in rows and columns, a plurality of row interconnections between circuit elements associated with applying input quantities (i.e. the input vector to each circuit element, a plurality of column interconnections between circuit elements associated with deriving the individual products formed in each circuit element in performing the matrix multiplication, and a plurality of output circuit means for obtaining the output vector.

The matrix multiplier is connected as follows. The analog input quantities forming the input vector ($\overline{F}$) are applied to a plurality of electrical input terminals, four of which are illustrated and which bear the reference numerals 1–4, respectively. The matrix multiplier further comprises an 8×8 array of circuit elements of which twelve are shown and which bear reference numerals 5 through 16, respectively. The individual elements each include an input terminal and a pair of output terminals. The input terminals of the first row of circuit elements bear the reference numerals 17, 18 and 19 and they are connected together and to the first multiplier input terminal 1. Similarly, the input terminals 20, 21 and 22 of the second row of circuit elements are connected together and to the second multiplier input terminal 2. The third row of circuit elements also has its input terminals 23, 24 and 25 connected together and to the third multiplier input terminal 3 and the last row of circuit elements has its input terminals 26, 27 and 28 connected together and to the last multiplier input terminal 4.

A double column bus interconnects the two output terminals of the circuit elements in the same column. The circuit element 5 in the first column, for instance, has an upper terminal 27 and a lower circuit 28. As will be seen, the upper terminal 27 is associated with a positive quantity in the output and the lower terminal 28 is associated with a negative quantity in the output. The second circuit element (8) of the first column has a positive output terminal 29 and a negative output terminal 30. Similarly, each circuit element (5, 8, 11, 14) in the first column has a pair of output terminals for positive and negative output quantities. The output terminals of each circuit element in the first column are connected to a double bus, the positive terminals being connected to the first positive bus 31 and the negative output terminals being connected to a first negative bus 32. In a similar manner, the positive and negative output terminals of the second column of circuit elements (6, 9, 12 and 15) have their positive output terminals connected to the second positive bus 33 and their negative output terminals connected to the second negative bus 34. Finally, the last column of the circuit elements (7, 10, 13 and 16) have their positive output terminals connected to a last positive bus 35 and their negative output terminals connected to a last negative bus 36.

The outputs from the individual circuit elements collected in the double column buses are then consolidated into an N plurality of output circuits which form the output vector ($\overline{F}_r$). The first double column bus 31, 32 is connected to the positive and negative terminals respectively of a first differential output circuit 37. The differential output circuit 37 produces the first term ($F_r(0)$) of the output vector. Similarly, the second double column bus 33, 34 is connected to the positive and negative terminals, respectively of the second differential output circuit 38, which produces the second term ($F_r(1)$) of the output vector. Finally, the last double column bus 35, 36 is connected to the positive and negative terminals, respectively, of the last differential output circuit 39, which produces the last term ($F_r(7)$) of of the output vector.

The individual circuit elements 5 through 16 of the matrix may take one of several well known forms of which one will be described in detail subsequently. In this form, the circuit element is a stage of a charge coupled semiconductor device in which a charge proportional to the analog input quantity is injected into the substrate of the device and transferred (as symbolized by the dotted line) to a first change storage site 40. The first charge storage site is a rectangular region within the channel of the device and defined by a rectangular electrode, lying above and isolated with respect to the substrate. When a suitable voltage is applied to the electrode, charges previously transferred into the site are stored under the electrode. They are shifted into the site 40 from the left and away from the site to the right (using the orientations of FIG. 1) by additional means not shown. After momentary storage at site 40, the charges are next transferred to a second, partitioned storage site 41, 42. The partitioned site 41, 42 is symbolized by a pair of rectangular areas of which the upper is larger than the lower, and the sum of these areas is equal to the area of the first site 40, but not necessarily so. The split electrodes defining the second charge storage site causes a division of the charge transferred from the storage site 40 in proportion to their relative areas. The upper and lower storage sites are coupled to the upper and lower terminals 27, 28, respectively, which in turn are coupled to the first double column bus 31, 32. The relative areas of the storage sites 41, 42 encode the magnitude and sign of a stored value of "weight" corresponding to the matrix in expression (6).

Prior to a more detailed treatment of the construction of a partitioned charge storage site and the manner in which the partitioned charges from separate circuit elements of a column are combined at the differential output circuit, the relationship of geometry to the stored value should be explained. The constructional variables at the charge storage sites are the individual areas of the upper and lower sites whose combined areas are fixed at equality to the area of the charge input sites 40, and the allocation of the larger area to the positive (31) or negative (32) conductor of the double column bus. The areas (41, 42) are defined by the regions under the split electrodes, and their association with a positive or negative conductor of the double column bus is determined by an electrical connection from the electrodes to one or the other of the double conductors. In the matrix required for an 8 point Fourier transform, the required values of trigonometric weights are $0, \pm\frac{1}{8}, \pm\cos 45°/8$, i.e., five values as noted earlier. The zero is achieved by making the upper and lower storage areas associated with the positive and negative conductor of the double column bus equal. The circuit elements 12, and 13 illustrate a stored weight of "0". When the upper storage area (associated with the positive conductor of the bus) is larger than the lower storage area (associated with the negative conductor of the bus), a net positive value is encoded. When the weight is $\pm\frac{1}{8}$, the largest difference in areas exists. The circuit elements 5, 6, 7, 8, 11 and 14 have stored weights of $\pm\frac{1}{8}$. When the weight is $\pm\frac{1}{8}\cos 45$, a smaller difference in areas occurs. The circuit elements 9, 10, 15 and 16 have a stored weight of $+\frac{1}{8}\cos 45$. Had any of the illustrated circuit elements encoded a negative quantity, the areas of the lower electrodes would be larger than the upper by one of the two indicated ratios. Alternatively, the bus connections could be interchanged.

The matrix multiplier is completed by a plurality of differential output stages 37, 38 and 39 having positive and negative input terminals connected respectively to the positive and negative conductors of the double column buses (31, 32; 33, 34; and 35, 36). The function of each differential output stage is to measure the net differences in the stored charges of the eight circuit elements whose output terminals are coupled via the double column bus to that output stage. The output stage produces an output quantity which is normally a voltage proportional to the net difference in charge on the double column bus. Noting that each circuit element in the first column produces an output proportional to the injected charge ($q_i$) (whose charge is in turn proportional to the $f_i$), and to the stored weight ($a_{ij}$), the first differential output circuit produces an output quantity:

$$F_r(0)=[\tfrac{1}{8}f(0)+\tfrac{1}{8}f(1)+\ldots+\tfrac{1}{8}f(7)]$$

which corresponds to the first equation in the set of expression (5) and the first term $F_r(0)$ in the output vector of the Fourier transform. Similarly, each of the succeeding differential output stages 38 . . . 39 produced a quantity represented by the succeeding equation in the set of expression (5) and the succeeding term in the output vector of the Fourier transform.

Summarizing the operation of the matrix multiplier; the analog inputs $f_o$ to $f_7$ are converted to proportional charges $q_o$ to $q_7$, which are distributed to an array of circuit elements each having a charge storage site for accepting the charge, and a partitioned storage site for division of the stored charge by a fixed ratio or weights [cos (rk×2π/8)] selected in accordance with a corresponding matrix value. Thus, each circuit element produces a product reflecting the analog input quantity and the stored weight. Products from a column of elements segregated by sign, are summed on the double column buses and the differences in sums, corresponding to each term $F_r(i)$ of the output vector appears at the output of the differential output stages. The analog inputs $f_o$ to $f_7$ to the matrix multiplier are clocked into the storage sites at a reasonable rate, typically 5-10 MHz. The matrix product or real part of the Fourier transform appears simultaneously upon the parallel output lines of the output stages. In order to perform a complete transform a second matrix is required for the sine weights corresponding to the imaginary terms.

Figure 2A:
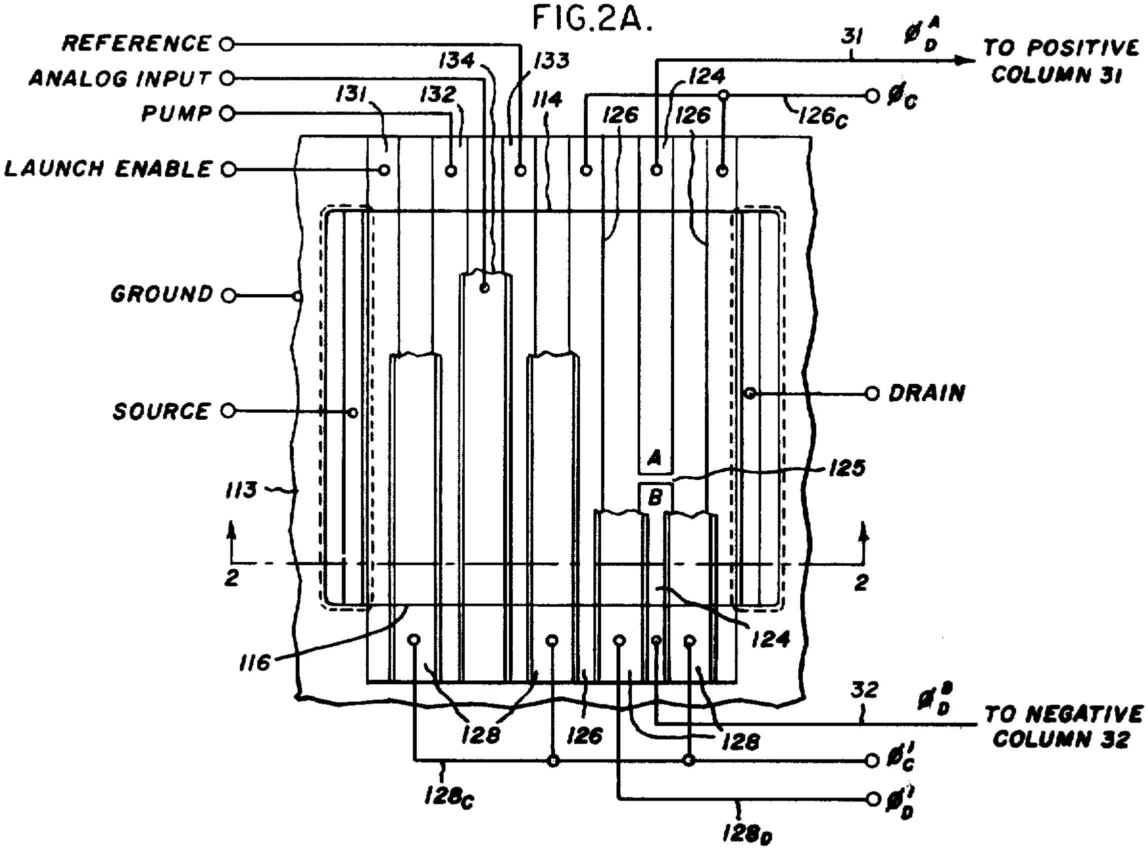
FIGS. 2A and 2B show a circuit element which comprises a one stage charge coupled device (CCD) having a pair of electrodes whose areas represent the magnitude and sign of a stored value suitable for use in the two dimensional array of FIG. 1.
Figure 2B:
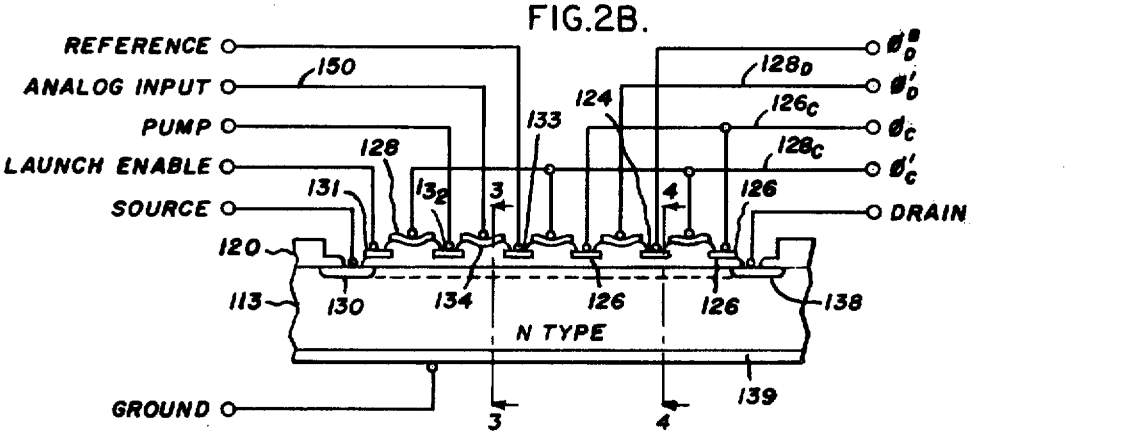
Figure 2C:
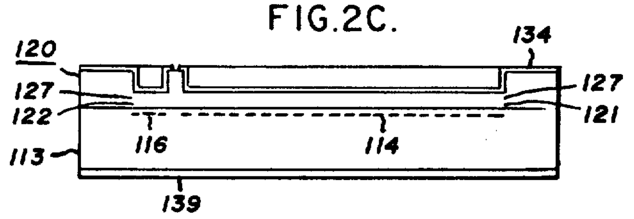
FIGS. 2C and 2D are sectional views taken along lines 3—3 and 4—4, respectively.
Figure 2D:
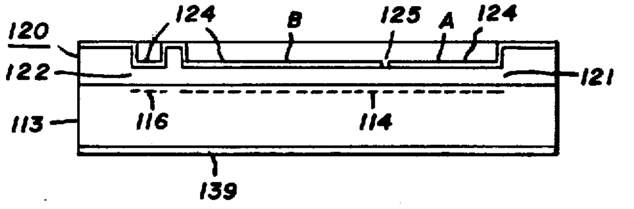

The construction of a suitable CCD stage using split electrodes for a proportionate charge division is described in U.S. Pat. No. 4,032,867, granted June 8, 1977 of Messrs. Engeler and Baertsch, and assigned to the Assignee of the present invention. The CCD device is pictured in FIGS. 2A through 2D. FIG. 2A being a plan view of the charge transfer device with split electrodes, and FIG. 2B being a sectional view taken along the sectional lines 2—2 of FIG. 2A. FIGS. 2C and 2D are sections 3—3 and 4—4, respectively. While it is the intention to incorporate the full text of the Engeler et al patent by reference, the present illustrations 2A through 2D picture the structures, relevant to the formation of an individual circuit element of the matrix depicted in FIG. 1. In particular, the matrix is formed upon a single monolithic substrate 113 of N-type conductivity silicon material, which is subdivided into an 8×8 array of single stage charge coupled devices. Each circuit element may be regarded as a one stage shift register, in which a channel portion 114 of uniform width is provided adjacent a major surface 115 of the substrate.

Overlying the major surface of the substrate 113 is a thick insulating member 120 of silicon dioxide having a pair of thin portions. A first thin portion 121 is of generally rectangular outline and lies in registry with the first channel portion 114 of the substrate. A second thin portion 122 is also of generally rectangular outline and lies in registry with the second channel portion 116 of the substrate. An electrode 124 is provided on the insulating member 120 overlying the thin portions 121 and 122 thereof and orthogonal to the length thereof. Electrode 124 is of uniform length in the direction of the length of the semiconductor channel portions 114 and 116 and the electrode 124 extends across both of the thin insulating portions 121 and 122 of the insulating member as well as over the bordering thick insulation portions of the insulating member 120. Electrode 124 has a split or gap 125 across the short dimension thereof over the first channel portion which divides the electrode into a first or A part and a second or B part. A third part of each of the electrodes overlies the second channel portion. The gap or split 125 in electrode 124 is small to allow the depletion regions or potential wells under the A and B parts to be coupled together efficiently to enable charge transferred to two potential wells under electrode 124 to equilibrate, i.e., divide in accordance with the relative area of the A and B parts. Preferably, regions of P-type conductivity are provided underlying the gap 125 to enable the conduction of charge between adjacent potential wells of split electrode 124, as is more fully described in U.S. Pat. No. 4,005,377 granted Jan. 23, 1977 of Engeler and assigned to the Assignee of the present invention. The aforementioned patent is incorporated herein by reference.

A second set of electrodes 126 which are unsplit are provided on the insulating member 120 overlying the thin portions 121 and 122 thereof and orthogonal to the length thereof. Each of the electrodes 126 is of uniform length in the direction of the length of the channel portions 114 and 116 and equal to the uniform length of electrode 124. Each of the electrodes 126 are spaced between adjacent electrode 124, and extends completely over both of the thin insulating portions of the insulating member 120 as well as the bordering thick insulation portions of the insulating member 120. An insulating layer 127 is provided over the electrodes 124 and 126. A plurality of transfer electrodes 128 are provided over the insulating layer 127, each of the transfer electrodes being insulatingly spaced between adjacent electrodes of the first and second pluralities and overlying the adjacent members thereof. Each of the transfer electrodes 128 is of substantially uniform extent in the direction of the length of the channel portions and extends entirely over the thin insulating portions of the insulating member 120 as well as the bordering thick insulating portions thereof.

Also provided in the embodiment of FIGS. 2A through 2D, is apparatus for forming and inserting (or introducing) packets of charge into the individual circuit elements of the matrix multiplier. The packets of charge introduced represent samples of the applied analog signal. Each packet of charge is related to the difference between the analog input voltage and a zero level bias voltage. This permits both positive and negative excursions of the analog input signal. The charge input apparatus includes a source of charge in the form of a P-type conductivity region 130 of elongated configuration orthogonally disposed with respect to the length of channel portions 114 and 116 of the substrate and located at the left-handed end thereof. Overlying the main and parallel channel portions 114 and 116, extending entirely across the width thereof and identical in configuration to the conductor 126 are provided a launch-enable electrode 131, a pump electrode 132 and a reference electrode 133 arranged serially in the order recited. The launch-enable electrode 131 overlaps a portion of the P-type source 130. The launch-enable electrode 131 performs launching and enabling functions for each element of the matrix multiplier. A transfer electrode 128 is provided extending over the entire width of each circuit element and overlying the launch-enable electrode 131 and the pump electrode 132. An analog input electrode 134 is provided identical in form to transfer electrode 128, insulating overlying the pump electrode 132 and the reference electrode 133 and extending over only the first channel portion 116 of the substrate 113, as shown.

There is also provided in the embodiment of FIGS. 2A through 2D apparatus for removing charge after it is passed through each element of the matrix multiplier. To this end there is provided an elongated region of P-type conductivity or drain 138 at the right-handed end of the channel portions 114 and 116. The drain 138 is of elongated configuration with its long dimension parallel to the width dimension of the channel portions 114 and 116. The electrode 126 of the last stages of the main and parallel shift registers partially overlaps the drain 138. A conductive layer 139 of a suitable material such as aluminum is bonded to the lower surface of the substrate 113 to provide a ground connection. The portion of the device shown in FIGS. 2A through 2D and described above is a portion of the shift register of the transversal filter described and claimed in U.S. Pat. No. 4,032,867. The manner in which packets of charge varying in accordance with an analog signal are applied to the input to the apparatus and the manner in which charge is collected by a drain at the output are described in the aforementioned patent.

Figure 3:
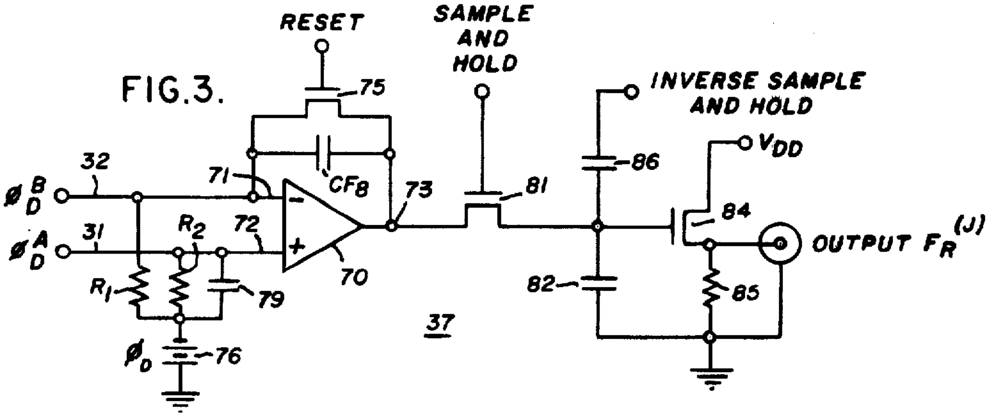
FIG. 3 shows an output circuit suitable for deriving one term of the output vector.

The manner in which packets of charge are transferred within the shift register of FIGS. 2A and 2B and the manner in which the charge is sensed during such transfer will be described in connection with the output circuit of FIG. 3. The output circuit of FIG. 3 is identical to the output circuit of FIG. 9 of the aforementioned patent and also identical to that of FIG. 3 of U.S. Pat. No. 4,004,157 granted Jan. 18, 1977 of Baertsch and Engeler and assigned to the Assignee of the present application.

The differences between the electrical quantities applied to the double column buses 31, 32, 33, 34, 35 and 36 represents the algebraic summations of the samples of an analog input signal multiplied by the positive and negative weighting factors of the circuit elements connected together in the respective double columns. The partial sums from a column and still separated by sign are combined algebraically in the differential output stages 37, 38, 39, each of which includes a high gain differential amplifier. The amplifier 70 of output stage 37 has an inverting input terminal 71, a non-inverting input terminal 72 and an output terminal 73. The differential amplifier may be any of a variety of operational amplifiers commercially available, for example, operational amplifier LM318 available from National Semiconductor Company of Santa Clara, Calif. The non-inverting terminal 72 is connected to the positive column 31 interconnecting the upper A parts of the split electrode 124 of the circuit elements in the first column. The inverting terminal 71 is connected to the negative column 32 interconnecting the lower or B parts of the split electrodes 124. The output terminal 73 is connected to the inverting input terminal 71 through a feedback capacitance $C_{FB}$. The potential of the inverting terminal 71 of the high gain differential amplifier with capacitance feedback follows the potential of the non-inverting terminal 72 and delivers a voltage at the output terminal 73 which is proportional to the difference in induced charge on the column conductor 32 divided by the feedback capacitance $C_{FB}$. A reset switch 75 in the form of a MOSFET transistor is connected across the feedback capacitor $C_{FB}$. A source 76 of fixed voltage having its positive terminal connected to ground provides $\phi_D$ voltage. A first resistor $R_1$ connected between the negative terminal of source 76 of $\phi_D$ voltage and the column conductor 32 provides a resetting and isolation function with respect to the A electrode. A second resistor $R_2$ connected between the negative terminal of the source 76 of $\phi_D$ voltage and the second column conductor 31 provides a resetting and isolation function with respect to the B electrode. A capacitor 79 is connected between the non-inverting terminal 72 and the negative terminal of source 76. The capacitance 79 is substantially equal to the capacitance of feedback capacitor $C_{FB}$ and is provided to maintain balance of capacitances on the two lines 31 and 32 to assure proper operation of the differential sensing circuit. If the capacitance of lines 31 and 32 are not equal, a small compensating capacitance may be connected to terminal 71 or 72. It should be noted that the output terminal 73 has a relatively low impedance with respect to ground and is essentially at A-C ground. Accordingly, as the total capacitance on the first line 31 is equal to the total capacitance on the second line 32, and its resistors R1 and R2 are equal, the time constants of lines 31 and 32 are equal.

Figure 4:
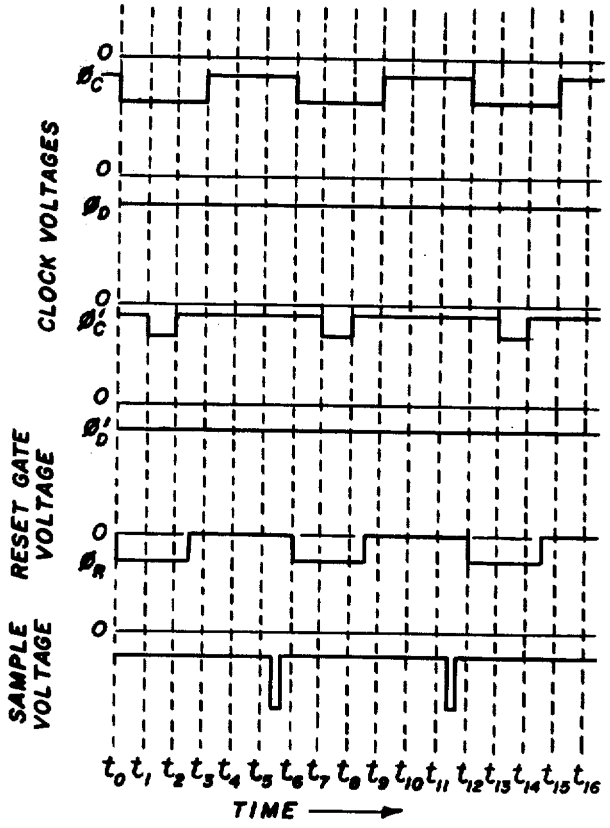
FIG. 4 is a diagram of voltage waveforms useful in explaining the operation of the one stage CCD and the derivation of an output.

A sampling circuit is connected between output terminal 73 and ground and comprises a MOSFET transistor 81 connected in series with a sampling capacitor 82. The source to drain conduction path of the MOSFET transistor 81 is connected in series with the sampling capacitor 82. The gate electrode of the MOSFET transistor 81 is connected to a source of sampling pulses, such as shown in FIG. 4. The output appearing across the sampling capacitor 82 is applied to a source follower circuit 83 which includes a MOSFET transistor 84, the source to drain conduction path of which is connected in series between a source of operating potential $V_{DD}$ and ground through an output impedance 85. The sampling capacitor 82 is connected between the gate of transistor 84 and ground. A voltage waveform which is the inverse of the sample voltage waveform of FIG. 4 is applied to sampling capacitor 82 through coupling capacitor 86 to cancel feedthrough of the sample pulses applied to transistor 81.

The differential output stage 37 of FIG. 1 derives an output which is a measure of the difference in charges induced on the A parts of the electrode 124 connected in positive conductor 31 and to the B or lower parts of the electrode 124 connected to negative conductor 32. The charge transfer mechanism will be explained in connection with the waveform diagrams of FIG. 4. The $\phi_C$, $\phi_C'$, and $\phi_D'$ voltages are applied to the lines 126c, 128c and 128d from suitable sources (not shown). The voltage $\phi_D$ is applied to the lines 31 and 32 from a source 76. Packets of charge representing signal samples are introduced at the input and are clocked along the semiconductor surface. However, the manner in which charges are clocked along will now be briefly described in connection with FIGS. 2A and 2B and 4. Typically, for an oxide thickness under the $\phi_C$ and $\phi_D$ electrodes 124 and 126 of about 1000 Angstrom Units and an oxide thickness under the $\phi_C'$ and $\phi_D'$ electrodes of about 2000 Angstrom Units, the voltage levels of the $\phi_C$ waveform are $-6$ and $-28$ volts and the voltage levels of the $\phi_C'$ waveform are $-3$ and $-22$ volts. The voltage level of $\phi_D$ and $\phi_D'$ are, respectively, $-15$ and $-9$ volts.

During the interval $t_0$–$t_1$, with the transfer gate voltage $\phi_C'$ at its least negative value, no charge is transferred from the storage site under the $\phi_D$ electrode to the storage sites underlying the $\phi_C$ electrode. During the interval $t_1$–$t_2$, with the $\phi_C$ voltage and the transfer gate voltage $\phi_C'$ at their most negative values, charge is transferred from the storage sites underlying the $\phi_D$ electrode 124 to the storage site underlying the $\phi_C$ electrode 126. At a point in time between $t_3$ and $t_4$ the voltage applied to the $\phi_C$ and the $\phi_C'$ clock lines has decreased. Thus, the surface potentials of the storage regions underlying the $\phi_C$ electrode set 126 have been raised to a value above the surface potentials underlying split electrode $\phi_D$ (124) which is maintained at a constant value. Also, the surface potential of the substrate underlying the $\phi_C'$ electrodes has been raised to a value above the surface potential of the substrate underlying the $\phi_D'$ electrodes, which are maintained at a constant value. Accordingly, the charge in the potential well underlying the $\phi_C$ electrodes 126 flows into the potential wall underlying the split electrode $\phi_D$. In order to assure transfer of charge in the potential wells underlying the $\phi_C$ electrodes 126 to the potential well underlying the $\phi_D$ split electrode 124, the voltage $\phi_C'$ is raised a short time earlier than the time of the rise in the $\phi_C$ voltage thereby establishing a barrier to the flow of charge in a direction opposite to the desired direction.

Continuing with the explanation of the operation of the circuit of FIG. 3, the reset switch 75 is closed from a time $t_0$ to a time somewhat after $t_2$ as seen from the reset waveform $\phi_R$ of FIG. 4 applied to the gate of transistor 75, and shorts out the feedback capacitor $C_{FB}$. During this interval the potential at the input terminal 71 is set equal to the potential on the output terminal 73 and the potential on input terminal 72. The potential on terminals 71, 72 and 73 of the differential amplifier would be essentially the potential of the $\phi_D$ source 76 assuming induced charge on line 31 has decayed to zero. At instant $t_3$, the $\phi_C$ voltage goes to its least negative value and thereby enables charge to be transferred from $\phi_C$ storage sites to the $\phi_D$ storage site. The reset switch 75 is opened somewhat before $t_3$, as the reset voltage $\phi_R$ goes to zero at that time. Charge transfer from the $\phi_C$ to the $\phi_D$ storage sites occurs during the interval $t_3$–$t_6$. When surface charge transfers from the $\phi_C$ to the $\phi_D$ sites, an opposing charge which is proportional to the transferred charge is induced in the $\phi_D$ lines 31 and 32. The capacitance of 31 is equal to the capacitance of line 32 as earlier noted. As the conductors are isolated from source 76 by resistors R1 and R2, respectively, the charge transfer induces a voltage change on the lines proportional to the individual charges induced thereon. The interval of transfer of charge, e.g. $t_3$–$t_4$, is relatively short in comparison to the time constant of the total capacitance of the line 32 and resistance R1 and in comparison to the time constant of the total capacitance of the line 31 and resistance R2. As the high gain differential amplifier has capacitance feedback to the inverting terminal, the inverting input terminal 71 follows the potential of the non-inverting terminal 72. Thus, a difference in induced charge on the lines 31 and 32 causes the amplifier to deliver charge from the output terminal 73 to the inverting input terminal 71 through the feedback capacitance to maintain equal voltage on the input terminals. Accordingly, the difference in charge induced on the lines is represented by the change in voltage at the output terminal ($\Delta e_o$) times the feedback capacitance $C_{FB}$. With a differential amplifier with a fast slew rate, the new level of output voltage is reached rapidly. With the time constants associated with the lines 31 and 32 relatively long with respect to the charge transfer time, the amplifier can quickly develop an output which is a measure of the difference in induced charge on the lines. Sampling the change in output level of voltage provides a measure of the sum of the weighted samples of the analog signal for each column of the matrix multiplier as described in FIG. 1. The output voltage is sampled after the charge transfer has been completed and during the interval (e.g. $t_5$–$t_6$, $t_{11}$–$t_{12}$, etc.) by energizing the MOSFET transistor 81 to charge the sampling capacitor 82 and thereby obtain a sample voltage which is a measure of the difference in charge delivered to the lines 31 and 32. The samples voltage is applied to the gate of the source follower 84 from which the output is obtained. As some of the sample pulse applied to the gate of transistor 81 may feed through to the source follower, the inverse of the sample pulse voltage is applied to the gate of the source follower 84 to cancel such feedthrough. After the transfer of charge from the $\phi_C$ storage sites to the $\phi_D$ storage sites, the voltage on the $\phi_D$ lines 31 and 32 due both to the transfer of charge and to the clock voltage fed through the interelectrode capacitance of the $\phi_C'$ electrodes with respect to $\phi_D$ electrodes, decay through the resistances R1 and R2. Each of the above voltages may be several volts. Note that the difference in voltage on the lines 31 and 32 upon the transfer of charge into the $\phi_D$ electrodes is measured in the order of tenths of a volt. U.S. Pat. No. 4,004,157 referenced previously describes the required time constants for lines 31 and 32 so that accurate charge differences are achieved by the output circuitry.

Actuation of the reset switch 75 at time $t_6$ after sampling has been accomplished causes the potential of terminal 71 to be fixed to the potential of the non-inverting terminal 72 by feedback action through the direct connection from the output terminal 73 to the inverting input 72 and also causes the feedback capacitance $C_{FB}$ to be completely discharged and readied for another sensing operation. Thus, in response to transfer of charge from $\phi_C$ electrodes to the $\phi_D$ electrode, the circuit responds at a fast rate to provide a change in level of output at terminal 73 which is an an accurate measure of the difference in charge induced in lines 31 and 32, and thereafter the voltage on the lines 31 and 32 decay at a relatively slow rate to the voltage $\phi_D$ of source 76 before the next cycle of transfer of charge from the sites underlying the $\phi_C$ electrodes to the site underlying the $\phi_D$ electrode.

As the $\phi_D$ electrodes connected to lines 31 and 32 are capacitively coupled to the $\phi_C$ electrodes, clocking voltage on the $\phi_C'$ electrodes feeds through to the lines 31 and 32. As the signal varies, both the inverting terminal 71 and the non-inverting terminal 72 vary by the same amount and in the same direction when the coupling capacitances to the lines 31 and 32 are substantially the same. The amplifier 70 rejects this common mode signal.

The plurality of single stage charge coupled devices and their associated output circuits described above from the essential elements of the matrix multiplier shown in FIG. 1. In the preferred implementation, each of the input terminals 1, 2, 3, 4 of FIG. 1 are connected to the appropriate analog input terminal 150 of each single stage CCD element. FIG. 1 shows the required connections. Clocking electrodes $\phi_C'$, $\phi_C$, $\phi_D'$ (not shown in FIG. 1 for clarity), and clock signals $\phi_R$ and also the sample and hold pulse, are all connected together in parallel fashion in the matrix multiplier to insure simultaneous sampling and transferring of charge thus assuring an output signal at each major clock cycle. Electrodes labeled REFERENCE, PUMP and LAUNCH ENABLE of FIGS. 2A, 2B are similarly connected. Also as shown in FIG. 1, the positive column electrode such as 31 and the negative column electrode such as 32 from each single stage device in a given column, are parallel connected to the output stage 37, whose operation has been already described.

Figure 5:
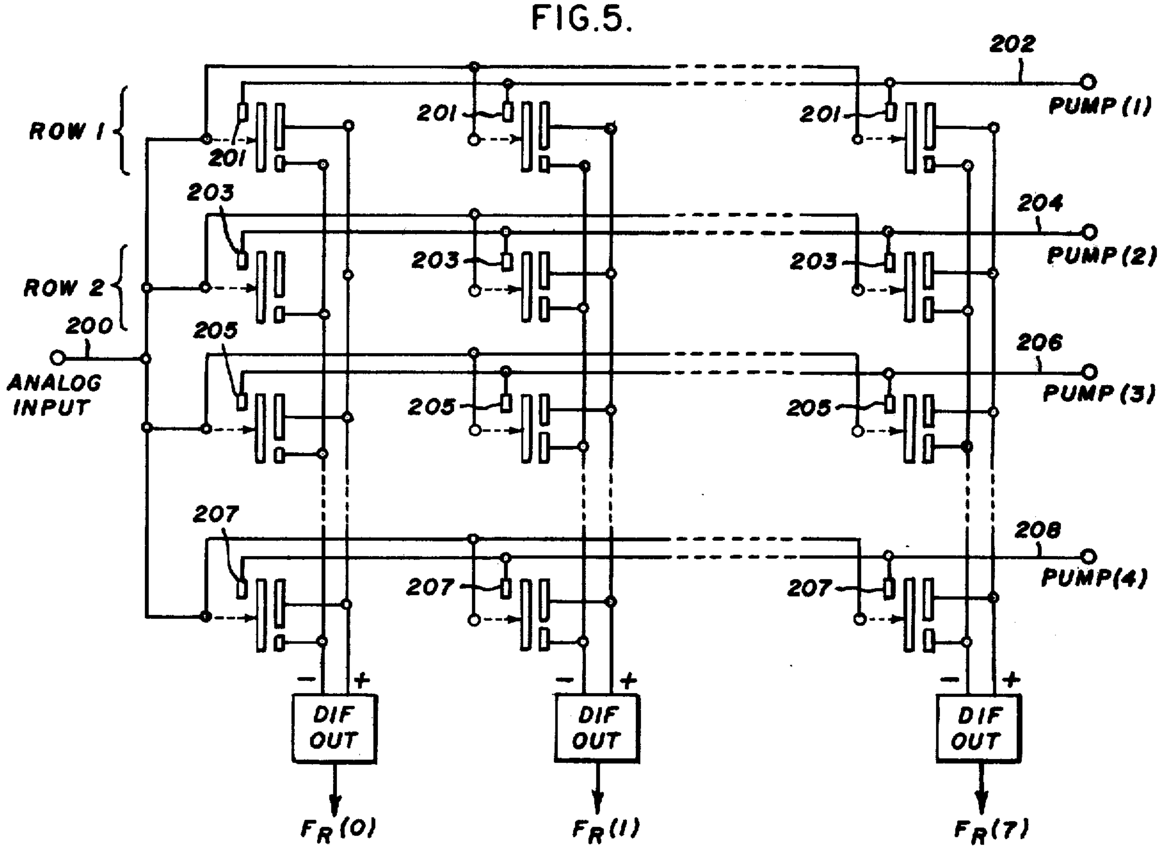
FIG. 5 is a simplified equivalent circuit representation of an array for computation of a discrete Fourier Transform for a time varying signal.

An alternate mode of operation useful for analyzing a single time varying signal in sequential fashion is also possible with the matrix multiplier by changing the interconnection of the clocking signals and also the input terminals of the device. FIG. 5 shows the essential interconnections and is identical to FIG. 1 in all respects except for two important changes. The first change is that all input terminals (1, 2, 3, 4) for the matrix multiplier are connected together and form a single input terminal 200 to the device. As before, all clocking signals are interconnected together in parallel fashion except for the PUMP clock signal. For each row in the matrix multiplier the PUMP clock signal is brought to an outside terminal of the device. This is illustrated in FIG. 5. The PUMP electrodes 201 are shown illustrated in the figure and are all connected to a single clock electrode 202 designated PUMP (1) for row number 1. Similarly, row two electrodes 203 are interconnected and are designated PUMP (2). Row 3 and row 4 of the matrix multiplier are similarly connected as shown in FIG. 5. These are the same electrodes already described for the matrix multiplier except for the method of interconnection. The pictorial representation of these electrodes were simply omitted from FIG. 1 for clarity.

In operation, the alternate structure shown in FIG. 5 is similar to the device previously described except that during the time interval $t_3$ to $t_7$, the PUMP clocking voltages 202, 204, 206, 208 are alternately first raised and then lowered in sequential fashion. This has the effect of storing charge proportional to the varying analog input voltage on pin 200 sequentially into row 1, row 2 and so on. The rest of the timing cycle shown in FIG. 4 can then be completed, thus achieving the desired outputs. This mode of interconnection can be used for example to compute the Discrete Fourier Transform for a time varying signal with no intermediate storage means.

What is claimed as new and desired to be secured by Letters Patent of the United States is:

1. A matrix multiplier comprising:

(a) electrical input terminal means for simultaneous application of a plurality ($\bar{X}$) of ordered analog input voltage quantities, where $$X = \begin{vmatrix} x_1 \\ x_2 \\ \cdot \\ \cdot \\ x_j \\ \cdot \\ \cdot \\ x_m \end{vmatrix}$$

(b) a plurality of electrical circuit elements arranged in a two dimensional array having rows and columns, each circuit element having:

(1) capacitive storage means whose capacity establishes a weight corresponding to a respective fixed coefficient of a two dimensional matrix (A) of fixed coefficients where $$A = \begin{vmatrix} a_{11} & a_{12} & \cdots\cdots & a_{1m} \\ a_{21} & a_{22} & & \\ & \cdot & & \\ & \cdot & & \\ & a_{ij} & & \\ & & \cdot & \\ & & \cdot & \\ a_{n1} & & a_{nm} & \end{vmatrix} \text{and}$$

(2) terminal means for applying an input and for deriving an output, (c) means for interconnecting the terminal means of the circuit elements in each row to said electrical input terminal means for applying a common input quantity ($x_j$) to each element in said row, each circuit element producing a product ($a_{ij}x_j$) proportional to the weight of the fixed coefficient ($a_{ij}$) of said electrical circuit element and to the applied analog input quantity ($x_j$), said products representing analog quantities of electrical charge, (d) means for interconnecting the terminal means of said circuit elements in each column for deriving an output ($y_i$) equal to the sum of products in each column of circuit elements, where $$y_i = \sum_{j=1}^{m} a_{ij}x_j = a_{i1}x_1 + a_{i2}x_2 + \ldots + a_{ij}x_j + \ldots a_{im}x_m \text{ and}$$

(e) a plurality of output circuit means, each coupled to a respective column interconnecting means for deriving an ordered analog output voltage quantity (Y), where $$Y = \begin{vmatrix} y_1 \\ y_2 \\ \cdot \\ \cdot \\ y_i \\ \cdot \\ \cdot \\ y_n \end{vmatrix} = AY$$

corresponding to the multiplication of said two dimensional matrix (A) of fixed coefficients by said plurality ($\bar{X}$) of ordered analog input quantities.

2. The matrix multiplier set forth in claim 1 wherein:

(a) said electrical input terminal means comprises a plurality of m input terminals to each of which a respective one ($x_j$) of said ordered analog input quantities is applied, and (b) each of said electrical input terminals is connected to one terminal of each circuit element in a respective row of circuit elements.

3. A matrix multiplier as in claim 2 wherein said circuit elements each comprise a pair of capacitances whose capacities determine the magnitude and sign of said fixed coefficient.

4. A matrix multiplier as in claim 3 wherein one capacitance in each circuit element is associated with coefficients of one sign and the other with coefficients of the other sign, their algebraic difference in capacity corresponding to the sign and magnitude of said fixed coefficient.

5. A matrix multiplier as in claim 4 wherein (a) each column interconnecting means comprises a first means for interconnecting the first capacitances, and a second means for interconnecting the second capacitances in said column of circuit elements, and wherein (b) each output circuit means comprising a differential amplifier whose inputs are coupled respectively to said first and second capacitances of the associated column of circuit elements for subtractively combining the output quantities.

6. A matrix multiplier as in claim 5 wherein said capacitive storage means are conductor-insulator-semiconductor charge storage cells, integrated on a common substrate.

7. A matrix multiplier as in claim 6 wherein each circuit element comprises one stage of a charge coupled device, the charge coupled to each charge storage cell being produced by a clocked charge transfer from an adjacent semiconductor region on said common substrate.

* * * * *